US011086232B2

(12) United States Patent
Sciacca et al.

(10) Patent No.: US 11,086,232 B2
(45) Date of Patent: Aug. 10, 2021

(54) MARK, OVERLAY TARGET, AND METHODS OF ALIGNMENT AND OVERLAY

(71) Applicant: ASML NETHERLANDS B.V., Veldhoven (NL)

(72) Inventors: Beniamino Sciacca, Amsterdam (NL); Sanjaysingh Lalbahadoersing, Helmond (NL); Jia Wang, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/753,441

(22) PCT Filed: Aug. 23, 2018

(86) PCT No.: PCT/EP2018/072733
§ 371 (c)(1),
(2) Date: Apr. 3, 2020

(87) PCT Pub. No.: WO2019/081091
PCT Pub. Date: May 2, 2019

(65) Prior Publication Data
US 2020/0319563 A1 Oct. 8, 2020

(30) Foreign Application Priority Data

Oct. 24, 2017 (EP) .................................. 17197914
May 2, 2018 (EP) .................................. 18170352

(51) Int. Cl.
G03F 7/20 (2006.01)
G03F 9/00 (2006.01)

(52) U.S. Cl.
CPC ...... G03F 7/70633 (2013.01); G03F 7/70683 (2013.01); G03F 9/7076 (2013.01)

(58) Field of Classification Search
CPC . G03F 9/7076; G03F 7/70683; G03F 7/70633
See application file for complete search history.

(56) References Cited

U.S. PATENT DOCUMENTS 6,952,253 B2   10/2005  Lof et al.
2001/0030299 A1*  10/2001  Shiraishi ................... G03F 9/70
                                                                 250/559.29
(Continued)

FOREIGN PATENT DOCUMENTS

EP   1628164   2/2006
EP   1788451   5/2007
(Continued)

OTHER PUBLICATIONS

International Search Report and Written Opinion issued in corresponding PCT Patent Application No. PCT/EP2018/072733, dated Oct. 9, 2018.
(Continued)

Primary Examiner — Steven Whitesell Gordon
(74) Attorney, Agent, or Firm — Pillsbury Winthrop Shaw Pittman LLP

(57) ABSTRACT

A resonant amplitude grating mark has a periodic structure configured to scatter radiation incident on a surface plane of the alignment mark. The scattering is mainly by excitation of a resonant mode in the periodic structure parallel to the surface plane. The effective refractive indexes and lengths of portions of the periodic structure are configured to provide an optical path length of the unit cell in the direction of periodicity that equals an integer multiple of a wavelength present in the spectrum of the radiation. The effective refractive indexes and lengths of the portions are also configured to provide an optical path length of the second portion in the direction of periodicity that is equal to half of the wavelength present in the spectrum of the radiation.

20 Claims, 14 Drawing Sheets

(56) References Cited

U.S. PATENT DOCUMENTS

2005/0024614 A1\* 2/2005 Bakker .................... G21K 1/06
                                                            355/67
2006/0033921 A1   2/2006 Den Boef et al.
2009/0310113 A1\* 12/2009 Musa ..................... G03B 27/54
                                                            355/70

FOREIGN PATENT DOCUMENTS

| JP | 2009302534 | 12/2009 |
| TW | 200617372 | 6/2006 |
| WO | 9949504 | 9/1999 |

OTHER PUBLICATIONS

Extended European Search Report and Written Opinion issued in corresponding European Patent Application No. 17197914.9, dated May 4, 2018.
Japanese Office Action issued in corresponding Japanese Patent Application No. 2020-519417, dated May 12, 2021.
Rosenblatt, David et al.: "Resonant Grating Waveguide Structures", IEEE Journal of Quantum Electronics, vol. 33, No. 11, pp. 2038-2059 (Nov. 1997).
Philipp, H.R. et al.: "Optical Constants of Silicon in the Region 1 to 10 ev", Physical Review, vol. 120, No. 1, (Oct. 1, 1960).

\* cited by examiner

MARK, OVERLAY TARGET, AND METHODS OF ALIGNMENT AND OVERLAY

CROSS-REFERENCE TO RELATED APPLICATIONS

This application is the U.S. national phase entry of PCT patent application no. PCT/EP2018/072733, which was filed on Aug. 23, 2018, which claims the benefit of priority of European patent application no. 17197914.9 which was filed on Oct. 24, 2017 and European patent application no. 18170352.1 which was filed on May 2, 2018 and which are incorporated herein in their entireties by reference.

FIELD

The present disclosure relates to a mark, an overlay target, and associated methods of alignment and determining an overlay error usable, for example, in the manufacture of devices by lithographic techniques.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD = k1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's sub-micron semiconductor devices, down to a few nanometers in the most critical layers.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of electromagnetic radiation onto a target and measure one or more properties of the scattered electromagnetic radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Conventional alignment marks consist of binary phase gratings that diffract incident radiation. They rely on the constructive interference of radiation diffracted by the top of the grating and the bottom of the grating at optimal grating depth. This light is then captured by an alignment sensor and used to define the mark position on the wafer. In the ideal scenario where the alignment marks are perfectly symmetric, assuming no wafer deformation, the Alignment Position Deviation (APD) is zero, resulting in the best overlay. However, as a result of processing, such as etching, chemical-mechanical polishing (CMP), annealing, deposition, oxidation, etc., real alignment marks are deformed in various ways, often resulting in asymmetries, which are not known beforehand. Typical asymmetries observed include Floor Tilt (FT), Top Tilt (TT) and Side Wall Angle (SWA). Furthermore, due to fluctuation in the processing, the depth of alignment marks can also vary around the nominal value.

When radiation coming from the alignment sensor interacts with the alignment mark and diffracts, such diffracted radiation contains also information regarding the mark geometry. Therefore, for asymmetric (deformed) alignment marks, the sensor detects a position that differs from the real position on the wafer: the APD is non zero. This causes overlay errors, that are strongly dependent on the type and magnitude of the asymmetry induced in the mark, and depend also on the mark depth.

Alignment marks that are less sensitive to being deformed during a specific process can be used if details on the effect of the process are known beforehand or after an investigation study. However, such marks would be highly specific for certain processes and semiconductor manufacturers. The standard approach includes performing alignment by employing different colors, since the information regarding the mark outline, that is contained in the diffracted radiation strongly depends on the color, it is possible to identify a color or a combination of colors that minimizes the APD, for a specific mark deformation. However, fluctuations of such mark deformation are present across the wafer and vary from wafer to wafer. As a result, the overlay performance is not optimal even in the scenario of using multiple colors. Furthermore, some alignment systems are limited to only two colors.

Overlay targets that are used to measure overlay error also suffer from the same problems of deformation. This can lead to inaccuracies in the measured overlay error.

SUMMARY

It is desirable to have marks and overlay targets that are less sensitive to mark asymmetry rising from process-induced deformation.

According to a first aspect of the present invention, there is provided a mark formed on a planar substrate, the mark comprising a periodic structure configured to scatter radiation incident on a surface plane of the alignment mark, the surface plane parallel to the substrate's plane, the scattering mainly by excitation of a resonant mode in the periodic structure parallel to the surface plane.

According to a second aspect of the present invention, there is provided a substrate comprising the mark of the first aspect.

According to a third aspect of the present invention, there is provided an overlay target comprising a lower mark in accordance with the first aspect, overlaid with an upper mark having a pitch the same as the lower mark and comprising a periodic structure configured to scatter radiation without exciting a resonant mode in the periodic structure parallel to its surface plane on which the radiation is incident.

According to a fourth aspect of the present invention, there is provided a substrate comprising the overlay target of the third aspect.

According to a fifth aspect of the present invention, there is provided a method of alignment comprising the steps:

providing an alignment mark formed on a planar substrate, the alignment mark comprising a periodic structure configured to scatter radiation incident on a surface plane of the alignment mark, the surface plane parallel to the substrate's plane, the scattering mainly by excitation of a resonant mode in the periodic structure parallel to the surface plane;

illuminating the alignment mark with radiation;

detecting the radiation scattered by the alignment mark arising from the illumination; and determining a position of the alignment mark using the detected radiation.

According to a sixth aspect of the present invention, there is provided a method of determining an overlay error comprising the steps:

providing an overlay target formed on a planar substrate, the overlay target comprising a lower mark overlaid with an upper mark having a pitch the same as the lower mark, wherein:

the lower mark comprises a periodic structure configured to scatter radiation incident on a surface plane of the lower mark, the surface plane parallel to the substrate's plane, the scattering mainly by excitation of a resonant mode in its periodic structure parallel to its surface plane; and the upper mark comprises a periodic structure configured to scatter radiation without exciting a resonant mode in its periodic structure parallel to its surface plane on which the radiation is incident;

illuminating the overlay target with radiation;

detecting radiation scattered by the overlay target arising from the illumination; and determining an overlay error between the upper and lower marks using the detected radiation.

BRIEF DESCRIPTION OF THE DRAWINGS

Embodiments of the invention will now be described, by way of example only, with reference to the accompanying schematic drawings, in which.

DETAILED DESCRIPTION

Figure 1:
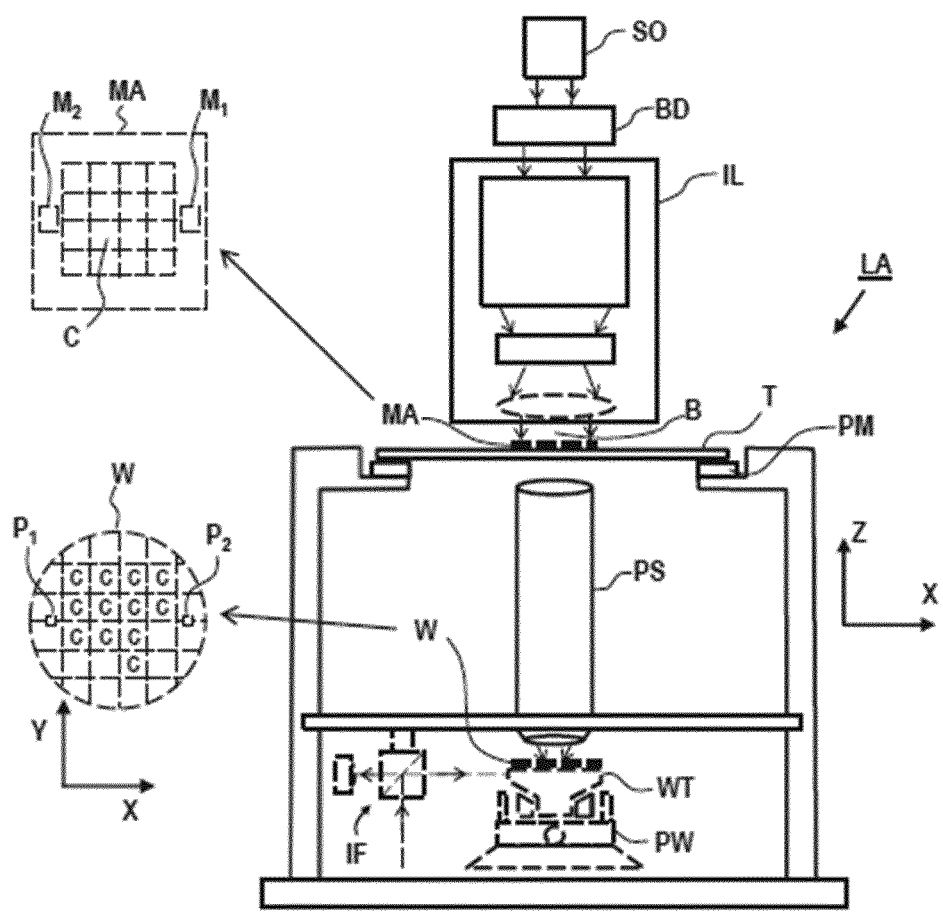
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Embodiments of the present invention provide novel marks made as binary gratings. These use coupling and leaking of surface modes. A general framework of mark design insensitive to asymmetries is provided. A general framework of mark design insensitive to depth variation is also provided. Only one single wavelength is required with the novel mark design to mitigate the effects of process-induced mark asymmetry. Furthermore, alignment signal strength (Wafer Quality WQ) may be tunable simply by adjusting the marks' pitch. The marks simplify reference wafer manufacturing, providing "golden" reference wafers for wafer-to-wafer error correction, since they are insensitive to process-induced mark asymmetry.

Embodiments provide a novel type of binary mark design that is insensitive to most type of asymmetries (FT, SWA). It is insensitive to depth variation and therefore to process fluctuations for any asymmetry (FT, SWA, TT).

Before considering the novel mark, the conventional phase grating will be described (FIG. 2) and the principle of amplitude gratings (FIG. 3) and generation of resonance (FIG. 4) will be described.

Figure 2:
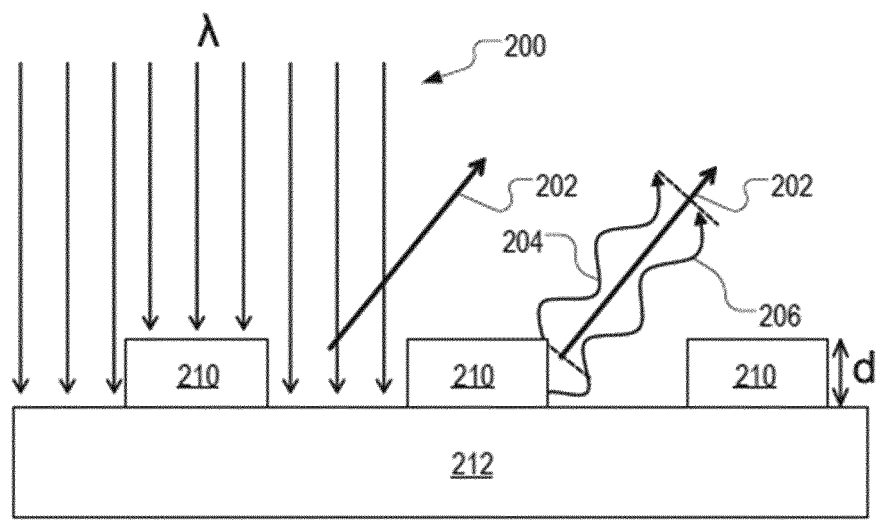
FIG. 2 depicts diffraction by a conventional phase grating.

FIG. 2 depicts diffraction by a conventional phase grating. Radiation 200 of wavelength $\lambda$ illuminates the periodic structure 210 formed on a planar substrate 212 which in this example is a grating shown in cross-section. The gap between the ridges 210 forms a trench of depth d extending down to the substrate 212. This (d) is the mark depth. Interference between scattered radiation 204, 206 reflected at the top and at the bottom of the grating 210 respectively is constructive for an optimal thickness d to produce scattered radiation 202. Diffraction thus occurs via modulation of the phase of the reflected wave. The grating introduces a periodic modulation of the wavefront.

Figure 3:
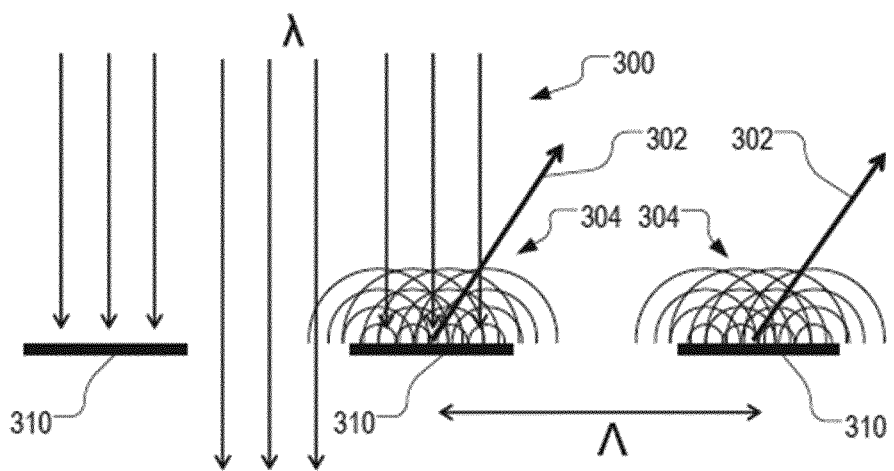
FIG. 3 depicts diffraction by an amplitude grating.

FIG. 3 depicts diffraction by an amplitude grating. Radiation 300 of wavelength $\lambda$ illuminates the grating 310. Radiation 302 diffracted by a grating with periodic apertures in a reflective film depends only on the period $\Lambda$. The reflective film is equivalent to a set of point sources 304. In contrast to the phase grating, diffraction occurs via modulation of the amplitude of the reflected wave, rather than the phase. In common with the phase grating, the amplitude grating introduces a periodic modulation of the wavefront.

Figure 4:
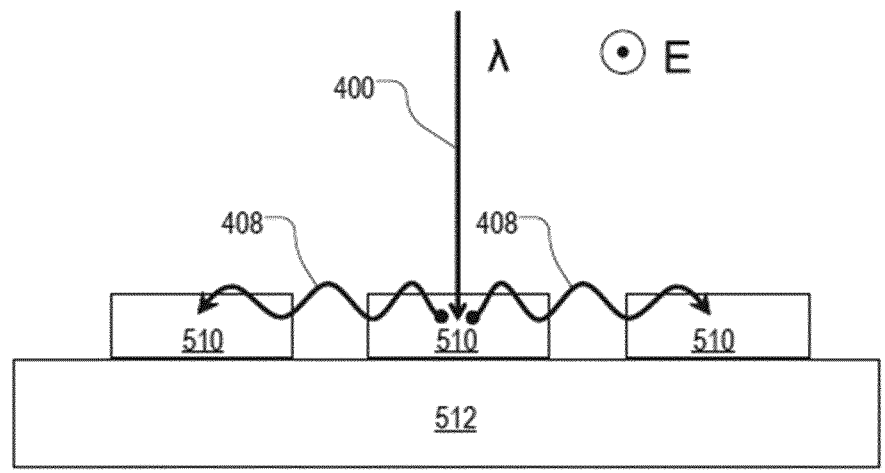
FIG. 4 depicts a grating in the resonance regime.

FIG. 4 depicts a grating in the resonance regime. Radiation 400 of wavelength $\lambda$ illuminates the grating 510. The incoming radiation 400 resonantly excites to counter-propagating waves 408 in the grating plane. The grating itself introduces the momentum required.

Figure 5:
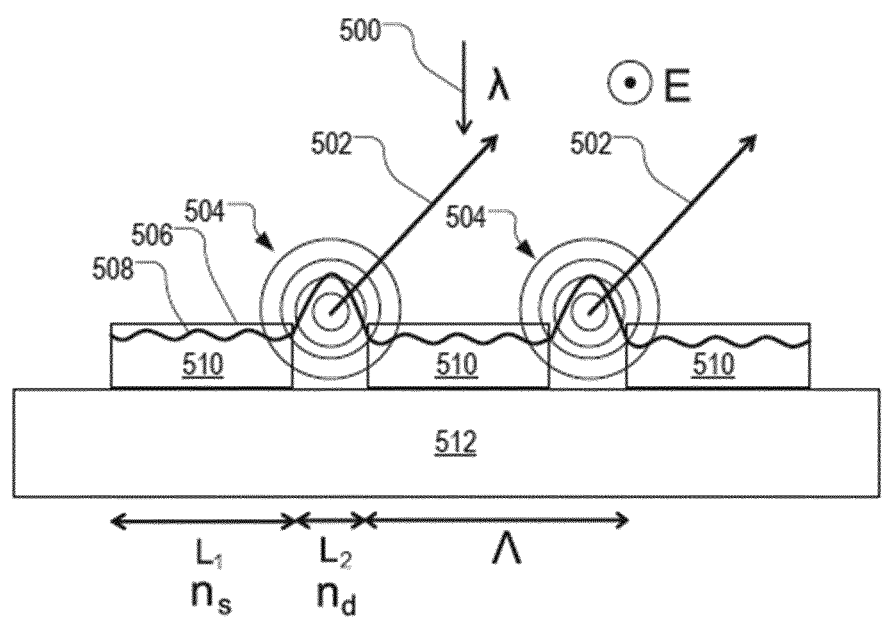
FIG. 5 depicts a resonant amplitude mark, in accordance with an embodiment of the present invention.

FIG. 5 depicts a resonant amplitude mark, in accordance with an embodiment of the present invention. A mark is formed on a planar substrate 512. The mark has a periodic structure configured to scatter radiation 502 of wavelength λ incident 500 on a surface plane 506 of the alignment mark. The surface plane 506 is parallel to the substrate's plane. The scattering is mainly by excitation of a resonant mode 508 in the periodic structure parallel to the surface plane.

The periodic structure has a repeated unit cell divided into adjacent first 510 and second 504 portions along a direction of periodicity (left-to-right in the cross-section of FIG. 5).

The first portion 510 has a first effective refractive index ($n_s$) and a first length ($L_1$) along the direction of periodicity. The second portion 504 has a second effective refractive index ($n_d$), which is lower over its optical path compared to the first effective refractive index, and a second length ($L_2$) along the direction of periodicity.

The effective refractive indexes ($n_s$, $n_d$) and lengths ($L_1$, $L_2$) of the portions are configured to provide an optical path length of the unit cell in the direction of periodicity ($n_sL_1 + n_dL_2$) that equals an integer multiple of a wavelength present in the spectrum of the radiation ($m\lambda$).

The wavelength of the incident radiation may be predetermined such that it matches the resonance design rules. Alternatively, broadband radiation may be incident on a marker and an alignment sensor frequency filter may be tuned afterwards to select the resonant mode wavelength.

The effective refractive indexes ($n_s$, $n_d$) and lengths ($L_1$, $L_2$) of the portions are also configured to provide an optical path length of the second portion in the direction of periodicity ($n_dL_2$) that is equal to half of an integer multiple of the wavelength present in the spectrum of the radiation ($k\lambda/2$). These are conditions matching the radiation wavelength to the grating material boundary conditions so as to support a resonance.

In this example, the optical path length of the second portion in the direction of periodicity ($n_dL_2$) is equal to half of the wavelength present in the spectrum of the radiation ($\lambda/2$), therefore there is only one antinode of the resonant mode in the second portion 504, i.e. k=1. When k>1, there are an odd number of antinodes, but an even number of antinodes cancel out, leaving just one antinode that contributes to the scattering, but with reduced efficiency.

The mark is formed on a planar substrate such as a wafer W, as depicted as $P_1$ and $P_2$ in FIG. 1.

The radiation diffracted by the mark does not contain information regarding the mark outline, but only about the mark position on the wafer. The mark may be referred to as a Resonant Amplitude Mark (RAM). The terminology has been chosen to highlight the different working principle of such RAM with respect to traditional alignment marks based on phase grating (as described with reference to FIG. 2). "Mark" and "grating" may be used interchangeably. The grating may be a 1-dimensional (1-D) grating, as described with reference to the example of FIG. 5, but the invention is not limited to 1-D gratings. It may be applied to 2-D gratings with the effective refractive indices and lengths in both directions of periodicity configured to support a resonance.

In this mark design, radiation coming from the alignment sensor excites two counter-propagating waves in the grating plane. These two waves form a so called "standing wave", i.e. a resonant mode in the grating plane. As described with reference to FIG. 4, these two counter-propagating waves do not propagate through the mark depth, but remain at the mark surface, and therefore are not influenced by the mark depth.

This resonant mode effectively leaks light into grating orders, as any other type of mark, and can be captured in the very same way as for conventional marks, and therefore no new sensor design is required. In fact, the sensor will not be able to discern if the light comes from a RAM or a conventional mark, with the advantage that light coming from a RAM doesn't contain information about the mark outline, but only about the mark position, since the resonant mode lies in the grating plane. Effectively, this mark behaves as an amplitude mark, in the sense that the light diffracted in the grating orders comes from point sources localized on the grating surface in a periodic fashion, whose radiation properties don't depend on the mark depth. This is similar to the scenario with periodic slits opened in a reflective opaque film, as described with reference to FIG. 3.

With the appropriate design, this makes the mark much less sensitive to the presence of layer stacks below it, and it can be also be used as overlay target (see FIG. 17) or in mark stacking (see FIG. 16).

For configuration of the of the RAM, it is desirable to have efficient coupling to the resonant mode and efficient leaking of the mode in the sensor plane.

These can be provided by using the following design rules:

The optical path of the grating unit cell equals an integer multiple of the wavelength:

$$n_sL_1 + n_dL_2 = m\lambda \qquad (1)$$

and the optical path of the low index material (space) equals half the wavelength:

$$n_dL_2 = k\lambda/2, \qquad (2)$$

where $L_1 + L_2 = \Lambda$ (pitch) and k is an integer, preferably k=1. From these two simple design rules, different pitches can be used for a specific color, accordingly with the sensor specification (numerical aperture, NA). Therefore, for a fixed wavelength λ, an increase in the mark pitch Λ would result in a larger duty cycle.

Figure 6:
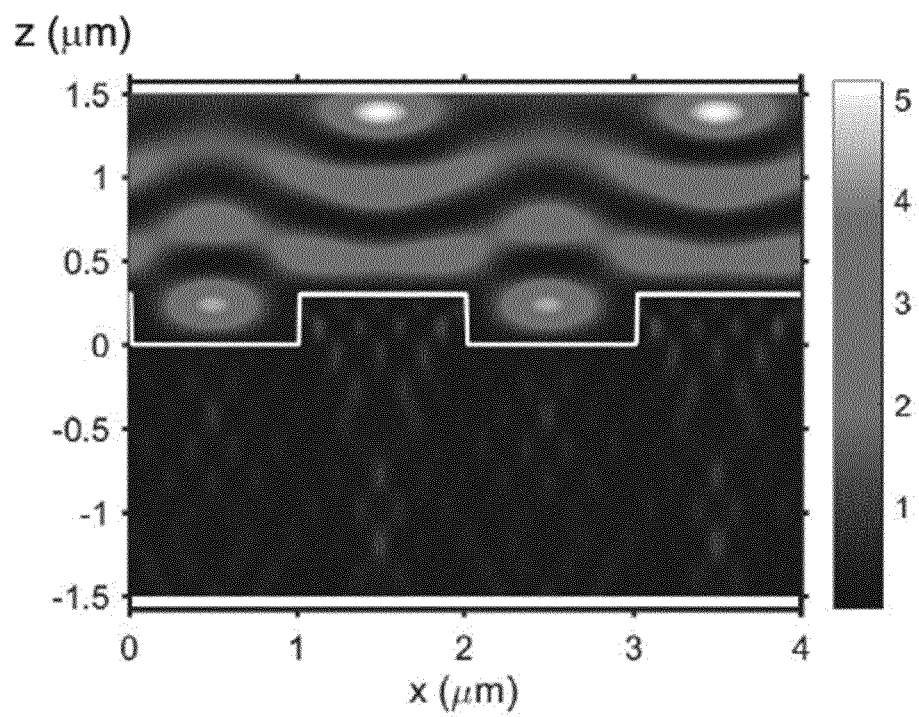
FIG. 6 depicts a simulation of the electric field for a phase grating similar to that shown in FIG. 2.

FIG. 6 depicts a simulation of the electric field for a phase grating similar to that shown in FIG. 2. Light shading represent higher electric field strength (see bar at the right of the figure).

The highest intensity of the field within the periodic structure of the grating is found in the trench at a Z position (vertical axis) of around 0.2 μm. This simulation uses a grating with a mark depth of 0.3 μm, a period of 2000 nm and a far infrared wavelength of 850 nm.

Figure 7:
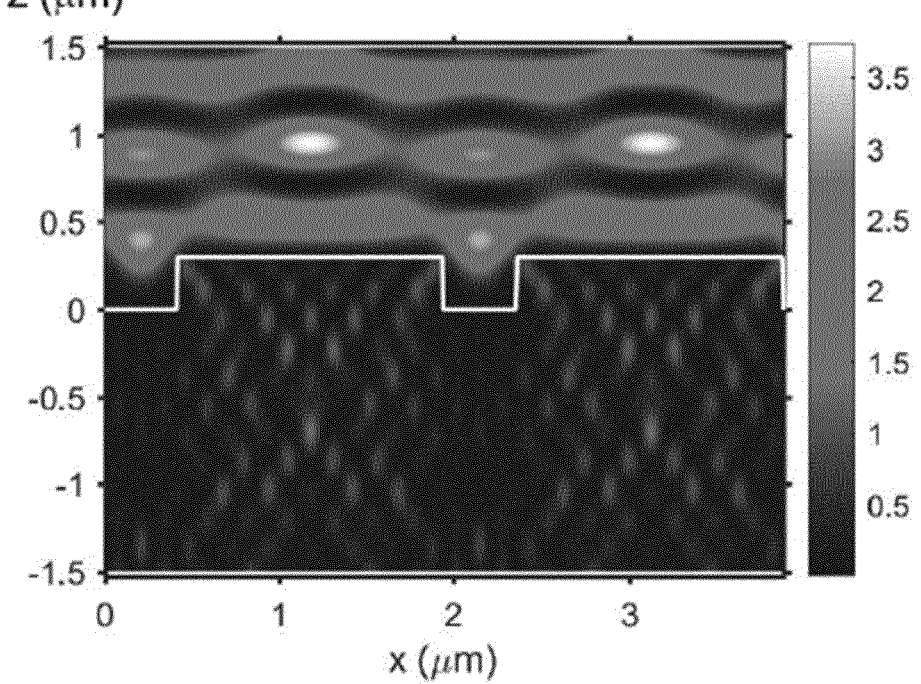
FIG. 7 depicts a simulation of the electric field for a resonant amplitude grating similar to that shown in FIG. 5.

FIG. 7 depicts a simulation of the electric field for a resonant amplitude grating similar to that shown in FIG. 3. The resonant mode excited in the grating plane (which is a standing wave) leaks scattered radiation into the grating orders, independently of depth of the mark. This is because the highest intensity of the field associated with periodic structure of the grating is found outside the trench at a Z position (vertical axis) of around 0.4 μm. The field is insensitive to depth of the marks and trench asymmetry. This simulation uses a grating with a mark depth of 0.3 μm a period of 1942 nm and a far infrared wavelength of 850 nm.

Figure 8:
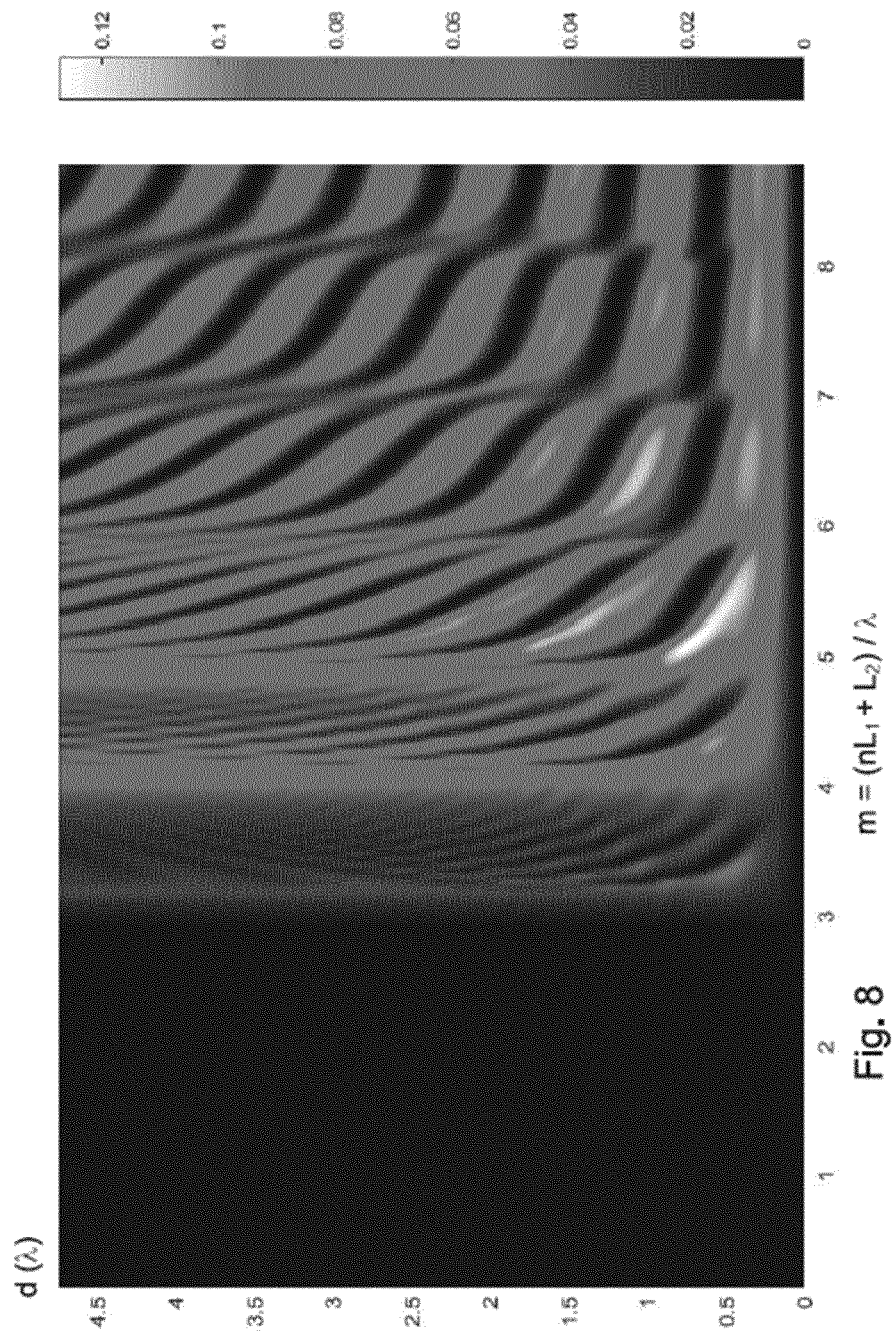
FIG. 8 depicts a diffraction efficiency map for the +1 diffraction order as a function of grating mark depth and optical path.

FIG. 8 depicts a diffraction efficiency map for the +1 diffraction order as a function of normalized grating mark depth d/λ (vertical axis) and optical path (horizontal axis).

When conditions (1) and (2) are met the diffraction efficiency (Wafer Quality, WQ) is independent of the mark's mark depth. The vertical light band at $m = n_sL_1 + L_2/\lambda = 4$ illustrates this point. In this example, $n_d = 1$.

Figure 9:
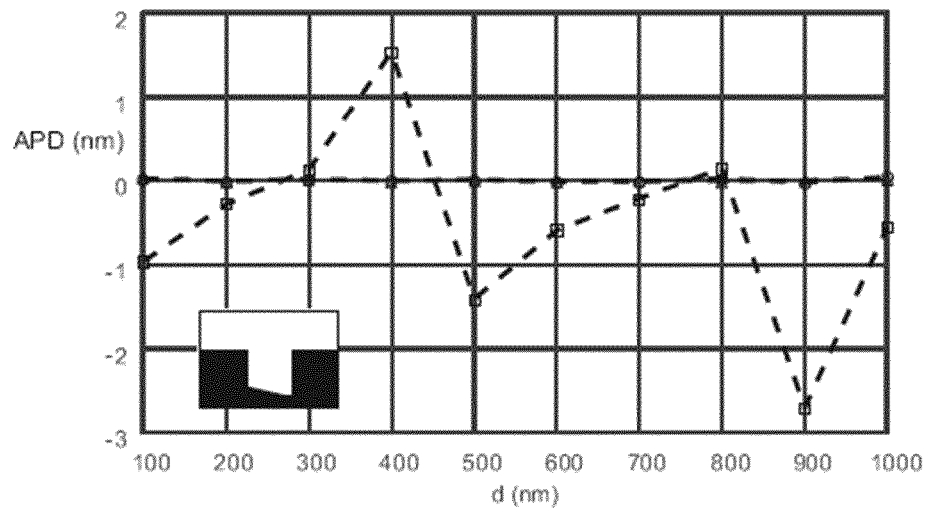
FIG. 9 depicts Alignment Position Deviation (APD) as a function of alignment mark depth in the presence of Floor Tilt asymmetry for a conventional phase grating and two resonant amplitude gratings respectively.

FIG. 9 depicts Alignment Position Deviation (APD) as a function of alignment mark depth in the presence of Floor Tilt (FT) asymmetry for a conventional phase grating and two resonant amplitude gratings respectively. The inset in FIG. 9 illustrates the shape of the Floor Tilt asymmetry. In this case the floor tilt is a 1 nm difference in depth from one side of the trench to the other. The conventional phase grating has a 3.2 µm pitch and its graph has a square marker. The resonant amplitude gratings have a 1.94 and 3.11 µm pitch respectively and their graphs have circle and triangle markers respectively. The wavelength is 850 nm.

Figure 10:
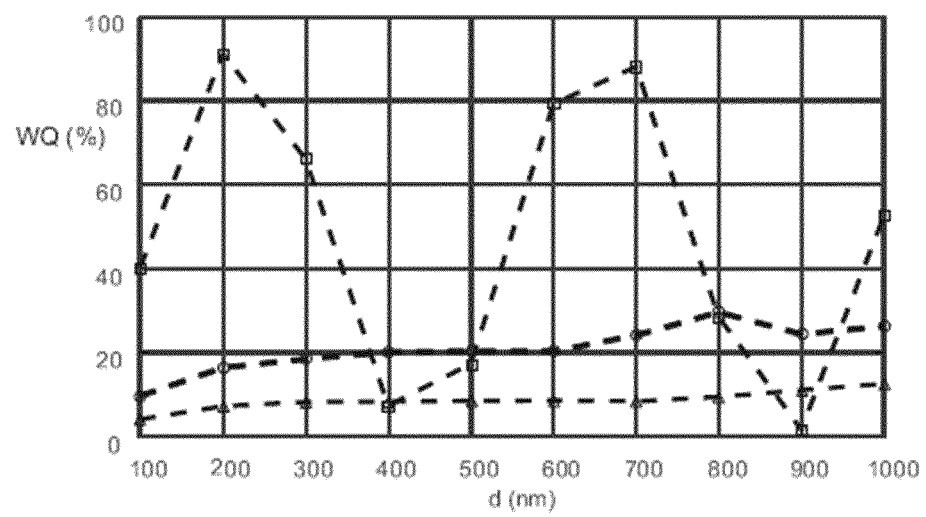
FIG. 10 depicts Wafer Quality (WQ) as a function of alignment mark depth in the presence of Floor Tilt asymmetry for a conventional phase grating and two resonant amplitude gratings respectively.

FIG. 10 depicts Wafer Quality (WQ) as a function of alignment mark depth in the presence of Floor Tilt asymmetry for a conventional phase grating and two resonant amplitude gratings respectively.

It can be seen from FIGS. 9 and 10 that the effect of FT on APD is orders of magnitude smaller for resonant amplitude gratings (graphs with circle and triangle markers) than for a conventional phase grating (graphs with square markers). For the resonant amplitude gratings (graphs with circle and triangle markers) the WQ is still high enough to be easily detectable (>20%). Note that WQ can be further increased, if necessary, by employing smaller m in Eq. 1. This can be done by reducing the mark pitch Λ, and/or deeply sub-wavelength sub-segmenting the ridge of the mark ($L_1$) as described with reference to FIG. 15. Also, employing smaller pitches would allow to use smaller marks, advantageously saving scribe lane real estate.

Furthermore, both for APD and WQ, there is no dependence observed as the mark depth fluctuates, as expected from the working principle. The APD for RAMs shown in FIG. 9 is basically zero (<0.05 nm), independently of the mark depth. The RAM used for FIGS. 9 and 10 are designed to work best at 850 nm (Far Infra-Red, FIR), but marks can be designed for other wavelengths such as 635 nm (RED).

Figure 11:
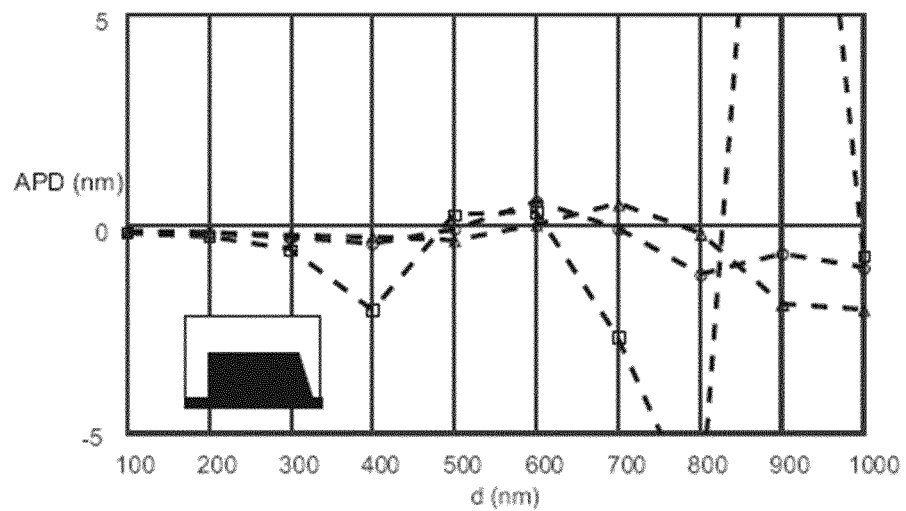
FIG. 11 depicts Alignment Position Deviation (APD) as a function of alignment mark depth in the presence of Side Wall Angle asymmetry for a conventional phase grating and two resonant amplitude gratings respectively.

FIG. 11 depicts Alignment Position Deviation (APD) as a function of alignment mark depth in the presence of Side Wall Angle asymmetry for a conventional phase grating and two resonant amplitude gratings respectively. The inset in FIG. 11 illustrates the shape of the Side Wall Angle asymmetry. In this case the Side Wall Angle is 1.1°. The conventional phase grating has a 3.2 µm pitch and its graph has a square marker. The resonant amplitude gratings have a 1.94 and 3.11 µm pitch respectively and their graphs have circle and triangle markers respectively. The wavelength is 850 nm.

Figure 12:
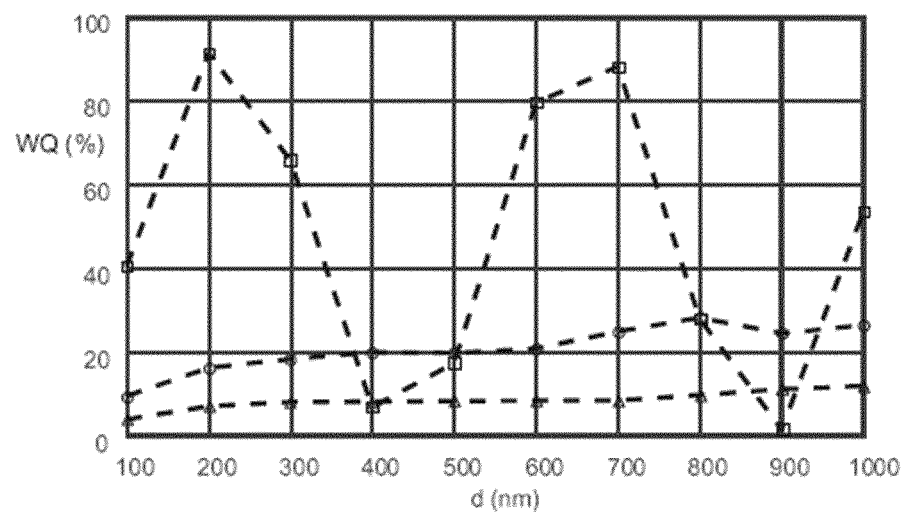
FIG. 12 depicts Wafer Quality (WQ) as a function of alignment mark depth in the presence of Side Wall Angle asymmetry for a conventional phase grating and two resonant amplitude gratings respectively.

FIG. 12 illustrates Wafer Quality (WQ) as a function of alignment mark depth in the presence of Side Wall Angle asymmetry for a conventional phase grating and two resonant amplitude gratings respectively.

It can be seen from FIGS. 11 and 12 that the effect of SWA on the APD is also smaller for the RAM when compared to conventional marks. Although for small mark depth the effect of SWA is in general limited, for RAM the fluctuation of the APD as a function of mark depth is much smaller. This becomes critical in the situation of processing induced fluctuation in the mark topology. Therefore also in this situation the RAM performance is superior to conventional marks.

Figure 13:
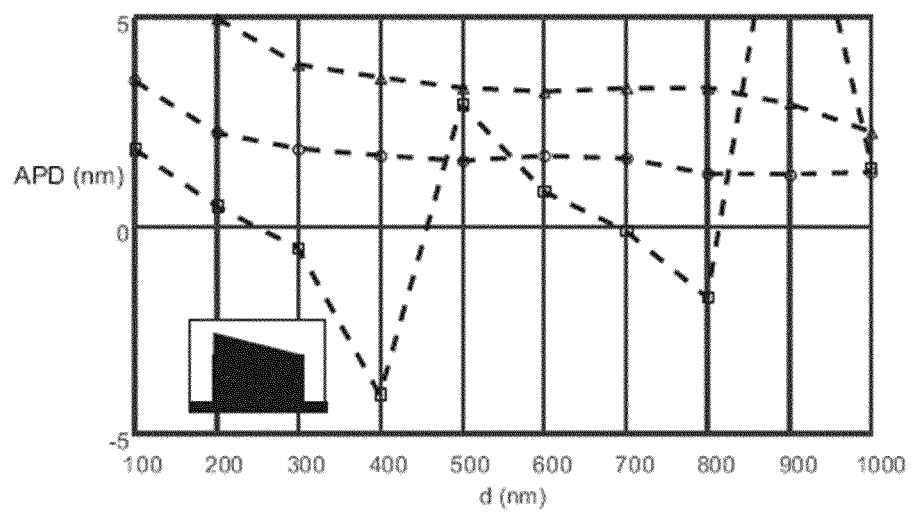
FIG. 13 depicts Alignment Position Deviation (APD) as a function of alignment mark depth in the presence of Top Tilt asymmetry for a conventional phase grating and two resonant amplitude gratings respectively.

FIG. 13 depicts Alignment Position Deviation (APD) as a function of alignment mark depth in the presence of Top Tilt asymmetry for a conventional phase grating and two resonant amplitude gratings respectively. The inset in FIG. 13 illustrates the shape of the Top Tilt asymmetry. In this case the top tilt is a 1 nm difference in height from one side of the trench to the other. The conventional phase grating has a 3.2 µm pitch and its graph has a square marker. The resonant amplitude gratings have a 1.94 and 3.11 µm pitch respectively and their graphs have circle and triangle markers respectively. The wavelength is 850 nm.

Figure 14:
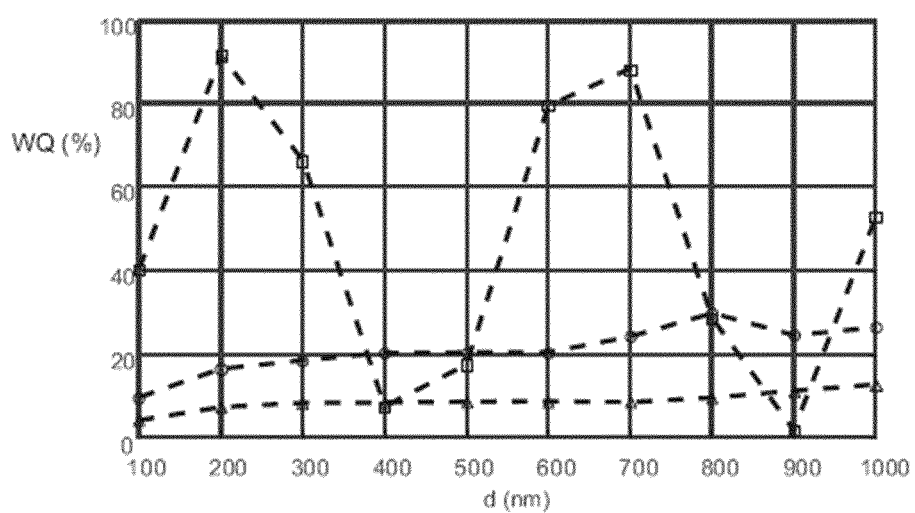
FIG. 14 depicts Wafer Quality (WQ) as a function of alignment mark depth in the presence of Top Tilt asymmetry for a conventional phase grating and two resonant amplitude gratings respectively.

FIG. 14 depicts Wafer Quality (WQ) as a function of alignment mark depth in the presence of Top Tilt asymmetry for a conventional phase grating and two resonant amplitude gratings respectively.

It can be seen from FIG. 13 that the effect of Top Tilt is a constant, non-zero APD for RAM. Although the performance is not as clear as in the scenarios of FT and SWA, it is worth nothing that the APD does not fluctuate as a function of mark's depth, and therefore can easily be corrected for, unlike for conventional marks.

Figure 15:
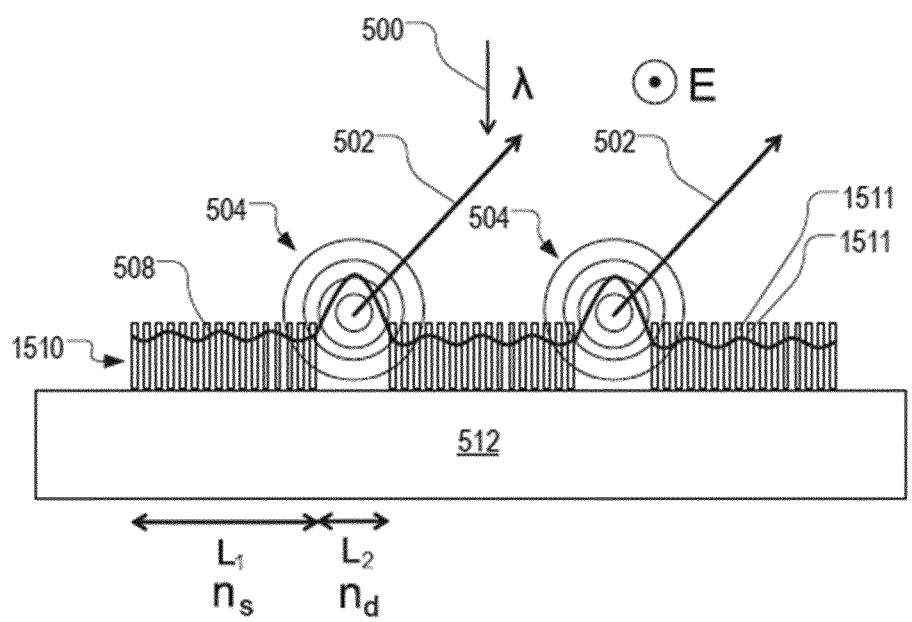
FIG. 15 depicts a resonant amplitude grating, with a sub-segmented portion of the unit cell, in accordance with an embodiment of the present invention.

FIG. 15 depicts a resonant amplitude grating, with a sub-segmented portion of the unit cell, in accordance with an embodiment of the present invention. Features in common with those described with reference to FIG. 5 have the same reference numerals. The first portion 1510 is sub-segmented to generate the first effective refractive index, $n_s$. In this example, the first portion is sub-segmented by a periodic substructure 1511 that has a duty cycle selected to generate the first effective refractive index, $n_s$.

In another embodiment (not shown) the second portion may be sub-segmented to generate the second effective refractive index, $n_d$. The second portion may be sub-segmented by a periodic substructure that has a duty cycle selected to generate the second effective refractive index.

Figure 16:
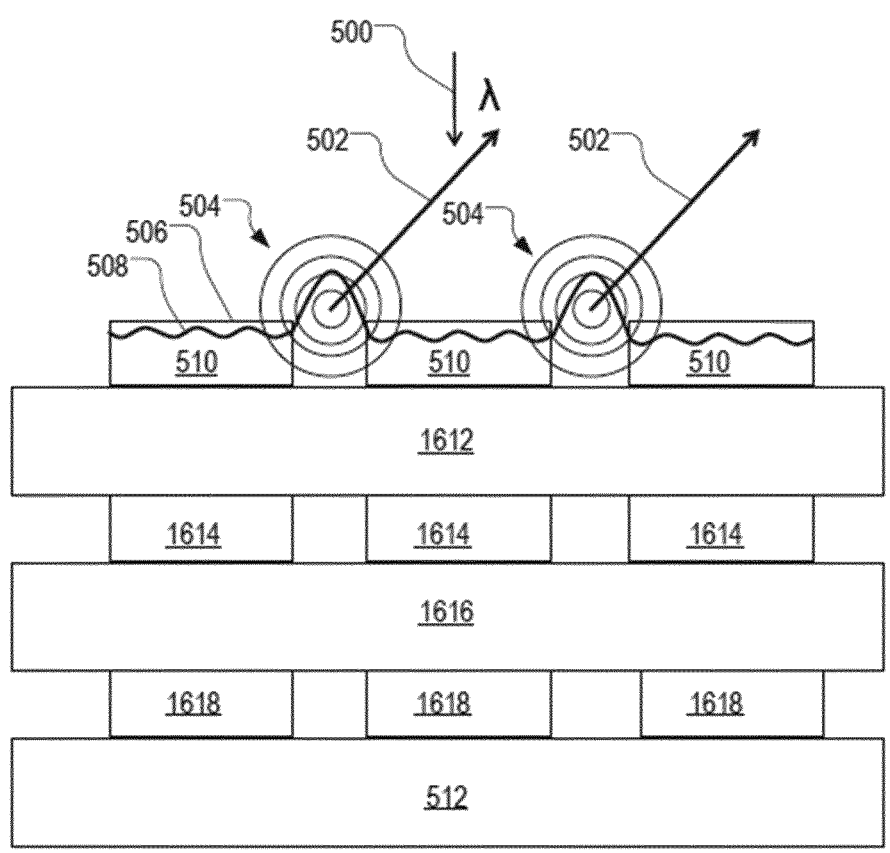
FIG. 16 depicts mark stacking with a resonant amplitude mark on top, in accordance with an embodiment of the present invention.

FIG. 16 depicts mark stacking with a resonant amplitude mark on top, in accordance with an embodiment of the present invention. Features in common with those described with reference to FIG. 5 have the same reference numerals. The resonant amplitude grating 510, 504, is formed on an interlayer 1612 on a stack of gratings 1614, 1616, 1618 on the planar substrate 512. For mark stacking as described with reference to FIG. 16, RAMs are less sensitive to the presence of other alignment marks located in the layers below, since the mode propagates in the grating plane. This reduces the cross-talk, therefore allowing a more robust readout. This may save space in the scribe-lane.

Figure 17:
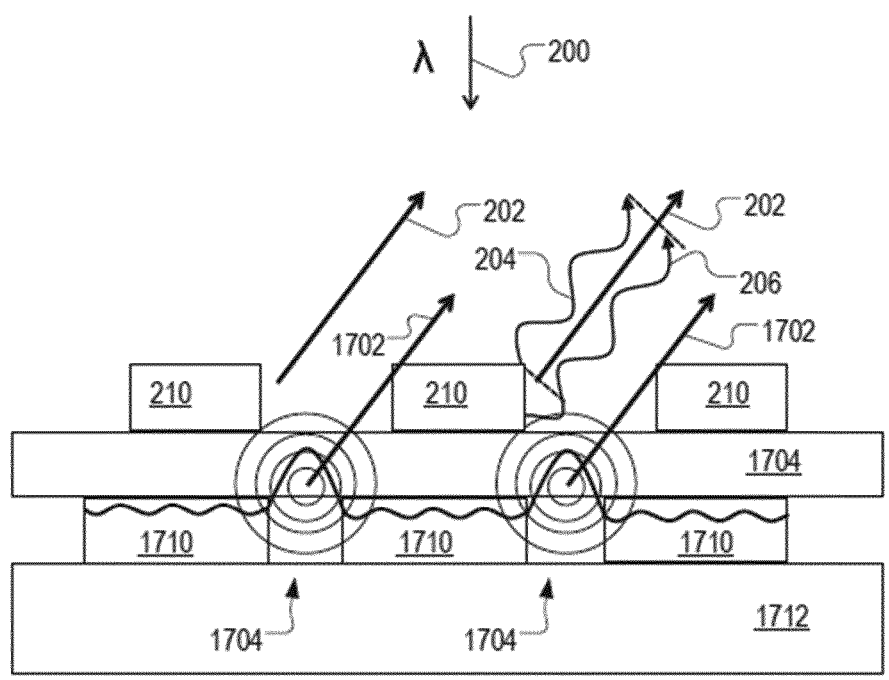
FIG. 17 depicts an overlay target with the bottom resonant amplitude mark, in accordance with an embodiment of the present invention.

FIG. 17 depicts an overlay target with the bottom resonant amplitude mark, in accordance with an embodiment of the present invention. Features in common with those described with reference to FIG. 2 have the same reference numerals.

The overlay target has a resonant amplitude mark as a lower mark with a periodic structure 1710, 1704 formed on a substrate 1712 such as described with reference to FIG. 5. The mark has a periodic structure configured to scatter radiation 1702 of wavelength λ incident 200 on a surface plane of the alignment mark.

The lower mark is overlaid with an upper mark having a pitch the same as the lower mark and comprising a phase grating periodic structure 210 on an interlayer 1704. The periodic structure 210 is configured to scatter radiation 202 without exciting a resonant mode in the periodic structure parallel to its surface plane on which the radiation is incident. The scattering from this upper grating is mainly by interference between radiation reflected from the top and bottom of the grating. The reference numbers of the upper phase grating represent the same features as described with reference to FIG. 2.

The overlay target is formed on a planar substrate such as a wafer W, as depicted in FIG. 1. This overlay target is insensitive to bottom grating asymmetry, because it uses a resonant amplitude mark as the bottom grating.

Figure 18:
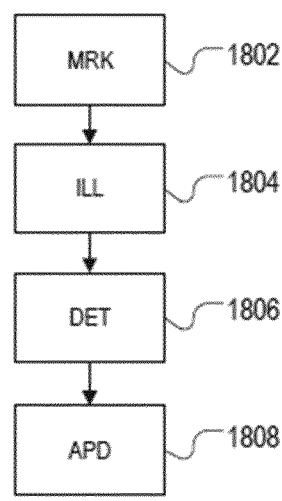
FIG. 18 is a flowchart of a method of alignment in accordance with an embodiment of the present invention.

FIG. 18 is a flowchart of a method of alignment in accordance with an embodiment of the present invention. The method of alignment has the following steps.

1802 (MRK): Providing an alignment mark formed on a planar substrate.

1804 (ILL): Illuminating the alignment mark with radiation of the predetermined wavelength.

1806 (DET): Detecting the radiation scattered by the alignment mark arising from the illumination.

1808 (APD): Determining a position of the alignment mark (APD) using the detected radiation.

The alignment mark has a periodic structure configured to scatter radiation incident on a surface plane of the alignment mark. The surface plane is parallel to the substrate's plane. The scattering is mainly by excitation of a resonant mode in the periodic structure adjacent parallel to the surface plane.

Figure 19:
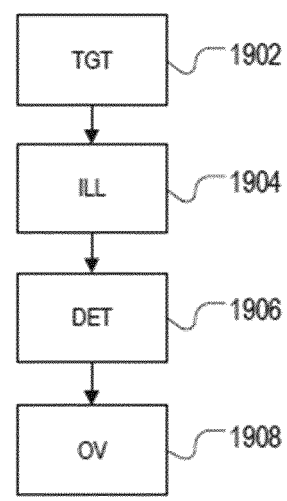
FIG. 19 is a flowchart of a method of overlay error measurement in accordance with an embodiment of the present invention.

FIG. 19 is a flowchart of a method of overlay error measurement in accordance with an embodiment of the present invention. The method of determining an overlay error has the following steps.

1802 (TGT): Providing an overlay target formed on a planar substrate. The overlay target has a lower mark overlaid with an upper mark having a pitch the same as the lower mark. The lower mark has a periodic structure configured to scatter radiation incident on a surface plane of the lower mark. The surface plane parallel to the substrate's plane. The scattering mainly by excitation of a resonant mode in its periodic structure adjacent parallel to its surface plane. The upper mark has a periodic structure configured to scatter radiation of the predetermined wavelength without exciting a resonant mode in its periodic structure adjacent parallel to its surface plane on which the radiation is incident.

1904 (ILL): Illuminating the overlay target with radiation of the predetermined wavelength.

1906 (DET): Detecting the radiation scattered by the overlay target arising from the illumination.

1908 (OV): Determining an overlay error OV between the upper and lower marks using the detected radiation.

With reference to FIGS. 18 and 19, the periodic structure has a repeated unit cell divided into adjacent first and second portions along a direction of periodicity. The first portion has a first effective refractive index and a first length along the direction of periodicity. The second portion having a second effective refractive index, which is lower over its optical path compared to the first effective refractive index, and a second length along the direction of periodicity. The effective refractive indexes and lengths of the portions are configured to provide an optical path length of the unit cell in the direction of periodicity that equals an integer multiple of a wavelength present in the spectrum of the radiation. The effective refractive indexes and lengths of the portions are configured to provide an optical path length of the second portion in the direction of periodicity that is equal to half of an integer multiple of the wavelength present in the spectrum of the radiation.

Preferably, the optical path length of the second portion in the direction of periodicity is equal to half of the wavelength present in the spectrum of the radiation.

The first portion may be sub-segmented to generate the first effective refractive index. For example, the first portion may be sub-segmented by a periodic substructure that has a duty cycle selected to generate the first effective refractive index.

The second portion may be sub-segmented to generate the second effective refractive index. For example, the second portion may be sub-segmented by a periodic substructure that has a duty cycle selected to generate the second effective refractive index.

As described with reference to FIGS. 20 to 23 below, the periodic structure may have a third portion interleaved with sequences of the repeated unit cells along the direction of periodicity, wherein the third portion has a third effective refractive index, and a third length along the direction of periodicity longer than the first length. In this case the effective refractive indexes and lengths of the portions are configured to provide an optical path length of a sum of: a plurality of the first portion; a plurality of the second portion; and the third portion, in the direction of periodicity, that equals an integer multiple of a wavelength present in the spectrum of the radiation.

The third effective refractive index typically equals the first effective refractive index. The third portion may be sub-segmented to generate the third effective refractive index. The third portion may be sub-segmented by a periodic substructure that has a duty cycle selected to generate the third effective refractive index.

As described in relation to FIG. 5, the following conditions are met for a RAM (resonant amplitude mark).

The optical path of the unit cell equals an integer multiple of the wavelength for efficient coupling to the resonant mode; and the optical path of the low index material (trench) equals half the wavelength for efficient leaking of the mode in the sensor plane, which are defined by the two equations:

$$n_s L_1 + n_d L_2 = m\lambda$$

$$n_d L_2 = \lambda/2$$

Where $L_1$ ($L_2$) is the width of the ridge (trench), $n_s$ ($n_d$) is the diffractive index of the ridge (trench) material and m is an integer ($\geq 2$). The main pitch of the mark is $\Lambda = L_1 + L_2$.

As a result, the mark pitch $\Lambda$ is correlated with mark duty cycle (DC), which is defined as $L_1/\Lambda$, for a fixed wavelength $\lambda$. However, the DCs of RAM are above 75% in practical alignment mark applications.

The DC of RAM can be increased by reducing the mark pitch $\Lambda$. However, the reduced pitch may not be compatible with the optical properties (for example Numerical Aperture) of the utilized alignment sensor(s).

The large DC limits the usage of RAM during mark design, since mark parameters, such as DC, pitch, and critical dimension (CD), are bounded due to semiconductor manufacture process tolerance and variation. Moreover, sub-segmented marks are extensively used by semiconductor manufacturers to reduce mark-to-device offset. Sub-segmentation of either the ridge (L1) or the trench (L2) of the RAM will result in even larger DC values.

In this embodiment, with reference to FIGS. 20 to 23, a resonant-amplitude supra-wavelength sub-segmented mark (RASSM) design is used to solve the above duty-cycle related problems, to extend the usage of resonant-amplitude mark (RAM) (as described with reference to FIGS. 5 and 15) while keeping the merits at the same time. Supra-wavelength means that the effective length along the optical path through the unit cell (along $L_1 + L_2$) is equal to or above a wavelength. Supra-wavelength is used herein to distinguish from sub-wavelength sub-segmentation, such as described with reference to FIG. 15, in which the sub-wavelength (and sub-resolution) sub-segmentation has an optical path through a sub-segmented unit cell smaller than a wavelength.

Figure 20:
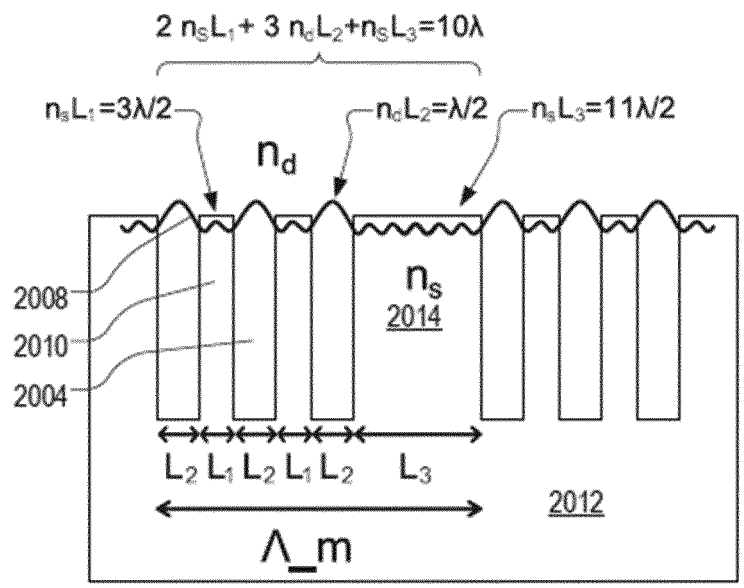
FIG. 20 depicts a supra-wavelength sub-segmented resonant amplitude mark, in accordance with an embodiment of the present invention.

An example is shown in FIG. 20. The design rules in this example include:

1) The effective width of the supra-wavelength sub-segmentation trench equals half the wavelength:

$$n_d L_2 = \lambda/2;$$

2) The effective width of the supra-wavelength sub-segmentation pitch equals an integer multiple of the wavelength:

$$n_s L_1 + n_d L_2 = m_1 \lambda, \text{ with } m_1 \geq 2; \text{ and}$$

3) The effective width of the main pitch equals an integer multiple of the wavelength:

$$(N_g-1)n_sL_1+N_gn_dL_2+n_sL_3=m_2\lambda, \text{ with } N_g-1\geq 1, N_g\geq 2,$$
$$\text{and } n_sL_3\geq 4.5\lambda,$$

where $N_g$ is the number of grooves in the repeated unit cell grating, $m_2$ is an integer. The main pitch of the mark $\Lambda\_m=(N_g-1)L_1+N_gL_2+L_3$. The main duty cycle $DC\_m=L_3/\Lambda\_m$. The supra-wavelength sub-segmentation pitch $\Lambda\_swsubseg=L_1+L_2$, and the supra-wavelength sub-segmentation duty cycle is $DC\_swsubseg=L_1/\Lambda\_swsubseg$.

Rules 2) and 3) result in efficient coupling to the resonant mode while Rule 1) results in efficient leaking of the mode in the grating plane, similar to embodiments described with reference to FIGS. 5 and 15.

FIG. 20 depicts a resonant amplitude mark, in accordance with an embodiment of the present invention.

A mark is formed on a planar substrate 2012. In common with the mark of FIG. 5, the mark has a periodic structure configured to scatter radiation of wavelength λ incident on a surface plane of the alignment mark. The surface plane is parallel to the substrate's plane. The scattering is mainly by excitation of a resonant mode 2008 in the periodic structure parallel to the surface plane.

The periodic structure has a repeated unit cell divided into adjacent first 2010 and second 2004 portions along a direction of periodicity (left-to-right in the cross-section of FIG. 20).

The first portion 2010 has a first effective refractive index ($n_s$) and a first length ($L_1$) along the direction of periodicity. The second portion 2004 has a second effective refractive index ($n_d$), which is lower over its optical path along the direction of periodicity compared to the first effective refractive index, and a second length ($L_2$) along the direction of periodicity.

The periodic structure also has a third portion 2014 interleaved with sequences of the repeated unit cells along the direction of periodicity. The third portion has a third effective refractive index, and a third length ($L_3$) along the direction of periodicity longer than the first length ($L_1$). In this example, the third effective refractive index equals the first effective refractive index ($n_s$).

The effective refractive indexes ($n_s$, $n_d$) and lengths ($L_1$, $L_2$) of the first and second portions are configured to provide an optical path length of the unit cell in the direction of periodicity ($n_sL_1+n_dL_2$) that equals an integer multiple of a wavelength present in the spectrum of the radiation ($m_1\lambda$). In this example, $m_1=2$. The effective refractive indexes ($n_s$, $n_d$) and lengths ($L_1$, $L_2$, $L_3$) of the portions are further configured to provide an optical path length of a sum of: a plurality of the first portion; a plurality of the second portion; and the third portion, in the direction of periodicity, that equals an integer multiple of a wavelength present in the spectrum of the radiation ($m_2\lambda$). In this example, $m_2=10$ as is shown below.

Thus in the example shown in FIG. 20:

$$\Lambda\_m=(N_g-1)L_1+N_gL_2+L_3=2L_1+3L_2+L_3$$

and substituting for $N_g$ 3 (three grooves comprising the plurality of repeated unit cells) and with $n_sL_1=3\lambda/2$, $n_dL_2=\lambda/2$ and $n_sL_3=11\lambda/2$, the third design rule, $$(N_g-1)n_sL_1+N_gn_dL_2+n_sL_3=m_2\lambda, \text{ becomes}$$

$$2n_sL_1+3\,n_dL_2+n_sL_3=2\times 3\lambda/2+3\times\lambda/2+11\lambda/2=10\lambda.$$

Thus, $m_2=10$.

The wavelength of the incident radiation may be predetermined such that it matches the resonance design rules. Alternatively, broadband radiation may be incident on a marker and an alignment sensor frequency filter may be tuned afterwards to select the resonant mode wavelength.

The effective refractive indexes ($n_s$, $n_d$) and lengths ($L_1$, $L_2$) of the first and second portions are also configured to provide an optical path length of the second portion in the direction of periodicity ($n_dL_2$) that is equal to half of an integer multiple of the wavelength present in the spectrum of the radiation ($k\lambda/2$). These are conditions matching the radiation wavelength to the grating material boundary conditions so as to support a resonance.

In this example, the optical path length of the second portion in the direction of periodicity ($n_dL_2$) is equal to half of the wavelength present in the spectrum of the radiation ($\lambda/2$), therefore there is only one antinode of the resonant mode in the second portion 504, i.e. k=1. When k>1, there are an odd number of antinodes, but an even number of antinodes cancel out, leaving just one antinode that contributes to the scattering, but with reduced efficiency.

In the same way as described with reference to FIG. 15, the e portion may be sub-wavelength sub-segmented to generate the third effective refractive index. The third portion may be sub-wavelength sub-segmented by a periodic substructure that has a duty cycle selected to generate the third effective refractive index.

Figure 21:
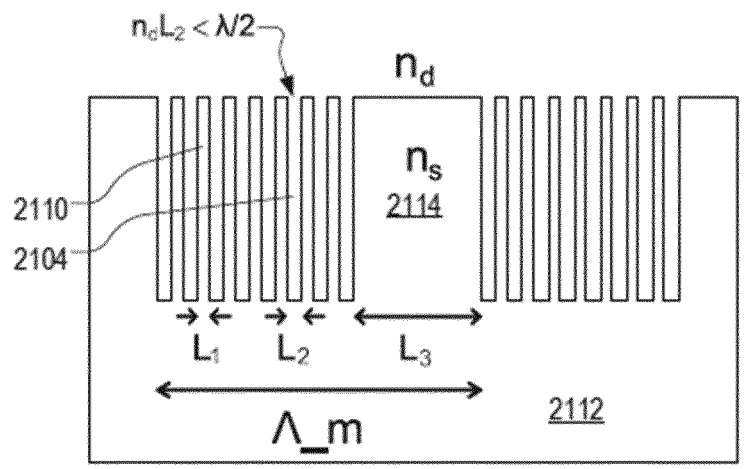
FIG. 21 depicts a sub-wavelength sub-segmented phase mark, for comparison with the supra-wavelength sub-segmented resonant amplitude mark of FIG. 20.

FIG. 21 depicts a sub-wavelength sub-segmented phase mark, for comparison with the resonant amplitude mark of FIG. 20. A mark is formed on a planar substrate 2112. The ridge 2110 and trench 2104 lengths $L_1$ and $L_2$ respectively in FIG. 21 are smaller than those (2010 and 2004) of FIG. 20. The sub-segmentation has an optical path through a sub-segmented unit cell smaller than a wavelength, so there is not enough room in the trench to allow resonance. Like for the RASSM described with reference to FIG. 20, the periodic structure of FIG. 21 also has a third portion 2114 of length $L_3$ interleaved with sequences of the repeated unit cells along the direction of periodicity.

Figure 22:
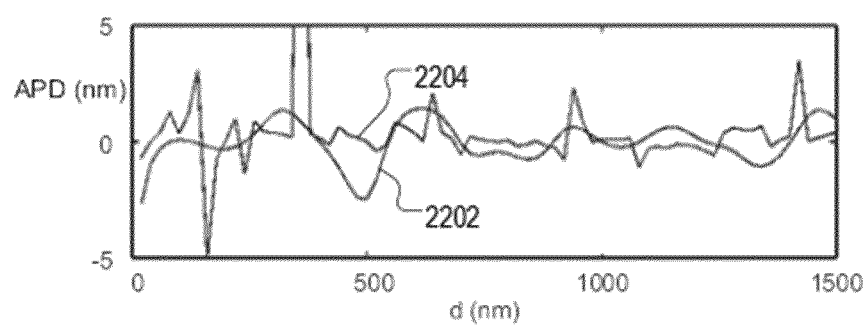
FIG. 22 depicts Alignment Position Deviation (APD) as a function of alignment mark depth in for the supra-wavelength sub-segmented resonant amplitude mark of FIG. 20 and the sub-wavelength sub-segmented phase mark of FIG. 21.

FIG. 22 depicts simulated Alignment Position Deviation (APD) as a function of alignment mark depth in for the resonant amplitude supra-wavelength sub-segmented mark (RASSM) of FIG. 20 and the sub-wavelength sub-segmented phase mark of FIG. 21. APD as a function of mark's depth in the presence of 2 nm floor tilt is shown for RASSM 2202 (Λ_swsubseg=0.773 μm) and mark with standard sub-segmentation pitch 2204 (Λ_subseg=0.246 μm) respectively. The main pitch (Λ_m=3.25 μm), main DC (DC_m=39.31%), and sub-segmentation DC (DC_subseg=45.04%) of the two marks are the same. The wavelength is 850 nm with TE polarization.

Figure 23:
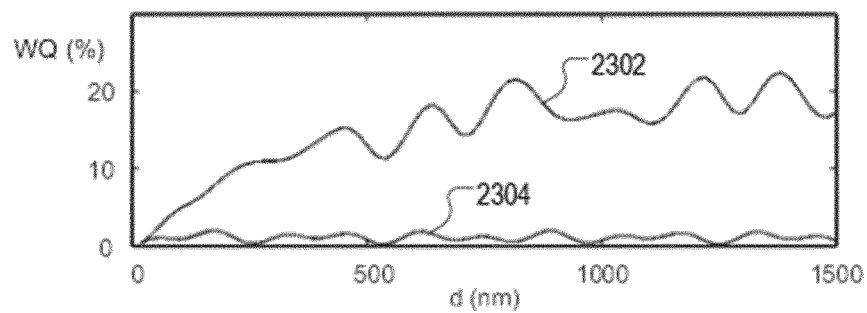
FIG. 23 depicts Wafer Quality (WQ) as a function of alignment mark depth in for the supra-wavelength sub-segmented resonant amplitude mark of FIG. 20 and the sub-wavelength sub-segmented phase mark of FIG. 21.

FIG. 23 depicts simulated Wafer Quality (WQ) as a function of alignment mark depth in for the resonant amplitude supra-wavelength sub-segmented mark (RASSM) of FIG. 20 and the sub-wavelength sub-segmented phase mark of FIG. 21. WQ as a function of mark's depth in the presence of 2 nm floor tilt is shown for RASSM 2302 (Λ_swsubseg=0.773 μm) and mark with standard sub-segmentation pitch 2304 (Λ_subseg=0.246 μm) respectively. The main pitch (Λ_m=3.25 μm), main DC (DC_m=39.31%), and sub-segmentation DC (DC_subseg=DC_swsubseg=45.04%) of the two marks are the same. The wavelength is 850 nm with TE polarization.

As can be seen from the simulation result shown in FIGS. 22 and 23, the APD and WQ respectively for RASSM supra-wavelength sub-segmented marks 2202, 2302 is compared to APD and WQ of standard sub-wavelength sub-segmented marks 2204, 2304 with the same main pitch (Λ_m), main DC (DC_m) and sub-segmentation DC (DC_subseg=DC_swsubseg). The APD of RASSM is more stable with less variation than the standard mark, while the wafer quality (WQ) of RASSM is much higher.

The RASSM of FIG. 20 has been compared to another mark with smaller supra-wavelength sub-segmentation DC but with the same main pitch, main DC and supra-wavelength sub-segmentation pitch. This means that for the other mark $L_2$ is increased and $L_1$ is decreased by the same amount. In this case both APD and WQ of RASSM are found to be more stable and have less variation compared to the other mark with smaller supra-wavelength sub-segmentation DC. This is because the design rules are not achieved as $n_d L_2 > \lambda/2$.

During this investigation, it has also been found that the APD and WQ variations are small as long as $L_2$ is not larger than half the wavelength, but WQ decreases with decreasing $L_2$. So the design Rule 1 is still valid for optimal RASSM design. For marks with larger sub-segmentation DC, the APD performance is as good as an optimized RASSM while its WQ is stable but lower. The reason is that when $L_2$ is equal to or smaller than half the wavelength, the trench width is too small for the incident electric field to enter. Moreover, the leaking of a mode (or modi) from neighboring ridges are not coupled. As a result, the electric field is only present outside of the trench and is not sensitive to both mark depth and mark asymmetry. When sub-segmentation DC is larger, the effective refractive-index contrast of the grating materials is smaller, the WQ is decreased as a result.

The RASSM of FIG. 20 may be used in in stacked gratings and overlay targets respectively, in the same way as described with reference to of FIGS. 16 and 17 respectively.

Embodiments of the present invention have several advantages. The alignment and overlay measurement methods are less complex; only one single wavelength is needed for alignment purposes, since WQ and APD do not vary as a function of the mark depth, for RAM.

The alignment and overlay measurement methods are more accurate; in the case of process-induced asymmetry, especially for FT, the APD obtained for RAM is extremely small; for a typical value of FT=1 nm, the APD is smaller than 0.5 Angstrom.

The alignment and overlay measurement methods are faster, especially in the case of tunable light sources that can provide only one color at a time.

The marks and targets may be used in golden reference wafers for wafer-to-wafer error correction, since they are insensitive to asymmetry.

There is an improvement in Copper Dual Damascene type structures; the presence of layers below the RAM mark has a limited impact on the signal, therefore allowing a more robust APD or OV readout.

As described with reference to FIG. 17, RAM can be used as the bottom grating of the overlay target, to reduce the effect of layers underneath the mark that affect the overlay readout signal.

Furthermore, embodiments of the present invention are compatible with smaller marks.

The RASSM embodiment described with reference to FIGS. 20 to 23 increases the selectivity of duty cycle, pitch, and sub-segmentation of RAM mark design. It also provides more stable APD and WQ compared with conventional sub-segmented marks. It is less sensitive to varying mark depth compared with conventional sub-segmented marks. This brings more freedom and selectivity for alignment sensors design. The RASSM embodiment extends the usage of RAM to fit practical semiconductor manufacturing process tolerance and variation.

Further embodiments are disclosed in the list of numbered embodiments below:

1. A mark formed on a planar substrate, the mark comprising a periodic structure configured to scatter radiation incident on a surface plane of the alignment mark, the surface plane parallel to the substrate's plane, the scattering mainly by excitation of a resonant mode in the periodic structure parallel to the surface plane.

2. The mark of embodiment 1 wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity, wherein the effective refractive indexes and lengths of the portions are configured to provide:

an optical path length of the unit cell in the direction of periodicity that equals an integer multiple of a wavelength present in the spectrum of the radiation; and an optical path length of the second portion in the direction of periodicity that is equal to half of an integer multiple of the wavelength present in the spectrum of the radiation.

3. The mark of embodiment 2, wherein the optical path length of the second portion in the direction of periodicity is equal to half of the wavelength present in the spectrum of the radiation.

4. The mark of embodiment 2 or 3, wherein the first portion is sub-segmented to generate the first effective refractive index.

5. The mark of embodiment 4 wherein the first portion is sub-segmented by a periodic substructure that has a duty cycle selected to generate the first effective refractive index.

6. The mark of any of embodiments 2 to 5, wherein the second portion is sub-segmented to generate the second effective refractive index.

7. The mark of embodiment 6, wherein the second portion is sub-segmented by a periodic substructure that has a duty cycle selected to generate the second effective refractive index.

8. The mark of any of embodiments 2 to 7 wherein the periodic structure has a third portion interleaved with sequences of the repeated unit cells along the direction of periodicity, wherein the third portion has a third effective refractive index, and a third length along the direction of periodicity longer than the first length, and wherein the effective refractive indexes and lengths of the portions are configured to provide:

an optical path length of a sum of: a plurality of the first portion; a plurality of the second portion; and the third portion, in the direction of periodicity, that equals an integer multiple of a wavelength present in the spectrum of the radiation.

9. The mark of embodiment 8, wherein the third effective refractive index equals the first effective refractive index.

10. The mark of embodiment 8 or embodiment 9, wherein the third portion is sub-segmented to generate the third effective refractive index.

11. The mark of embodiment 10, wherein the third portion is sub-segmented by a periodic substructure that has a duty cycle selected to generate the third effective refractive index.

12. A substrate comprising the mark of any preceding embodiment.

13. An overlay target comprising a lower mark in accordance with any of embodiments 1 to 12, overlaid with an upper mark having a pitch the same as the lower mark and comprising a periodic structure configured to scatter radiation without exciting a resonant mode in the periodic structure parallel to its surface plane on which the radiation is incident.

14. A substrate comprising the overlay target of embodiment 13.

15. A method of alignment comprising the steps:
providing an alignment mark formed on a planar substrate, the alignment mark comprising a periodic structure configured to scatter radiation incident on a surface plane of the alignment mark, the surface plane parallel to the substrate's plane, the scattering mainly by excitation of a resonant mode in the periodic structure parallel to the surface plane;
illuminating the alignment mark with radiation;
detecting the radiation scattered by the alignment mark arising from the illumination; and
determining a position of the alignment mark using the detected radiation.

16. The method of embodiment 15 wherein the periodic structure has a repeated unit cell divided into adjacent first and second portions along a direction of periodicity,
the first portion having a first effective refractive index and a first length along the direction of periodicity,
the second portion having a second effective refractive index, which is lower over its optical path compared to the first effective refractive index, and a second length along the direction of periodicity,
wherein the effective refractive indexes and lengths of the portions are configured to provide:
an optical path length of the unit cell in the direction of periodicity that equals an integer multiple of a wavelength present in the spectrum of the radiation and
an optical path length of the second portion in the direction of periodicity that is equal to half of an integer multiple of the wavelength present in the spectrum of the radiation.

17. The method of embodiment 15 or embodiment 16, wherein the optical path length of the second portion in the direction of periodicity is equal to half of the wavelength present in the spectrum of the radiation.

18. The method of any of embodiments 15 to 17 wherein the first portion is sub-segmented to generate the first effective refractive index.

19. The method of embodiment 18 wherein the first portion is sub-segmented by a periodic substructure that has a duty cycle selected to generate the first effective refractive index.

20. The method of any of embodiments 15 to 19 wherein the second portion is sub-segmented to generate the second effective refractive index.

21. The method of embodiment 20 wherein the second portion is sub-segmented by a periodic substructure that has a duty cycle selected to generate the second effective refractive index.

22. The method of any of embodiments 15 to 21 wherein the periodic structure has a third portion interleaved with sequences of the repeated unit cells along the direction of periodicity, wherein
the third portion has a third effective refractive index, and a third length along the direction of periodicity longer than the first length, and
wherein the effective refractive indexes and lengths of the portions are configured to provide:
an optical path length of a sum of: a plurality of the first portion; a plurality of the second portion; and the third portion, in the direction of periodicity, that equals an integer multiple of a wavelength present in the spectrum of the radiation.

23. The method of embodiment 22, wherein the third effective refractive index equals the first effective refractive index.

24. The method of embodiment 22 or embodiment 23, wherein the third portion is sub-segmented to generate the third effective refractive index.

25. The method of embodiment 24, wherein the third portion is sub-segmented by a periodic substructure that has a duty cycle selected to generate the third effective refractive index.

26. A method of determining an overlay error comprising the steps:
providing an overlay target formed on a planar substrate, the overlay target comprising a lower mark overlaid with an upper mark having a pitch the same as the lower mark, wherein:
the lower mark comprises a periodic structure configured to scatter radiation incident on a surface plane of the lower mark, the surface plane parallel to the substrate's plane, the scattering mainly by excitation of a resonant mode in its periodic structure parallel to its surface plane; and
the upper mark comprises a periodic structure configured to scatter radiation without exciting a resonant mode in its periodic structure parallel to its surface plane on which the radiation is incident;
illuminating the overlay target with radiation;
detecting radiation scattered by the overlay target arising from the illumination; and
determining an overlay error between the upper and lower marks using the detected radiation.

27. The method of embodiment 26 wherein the periodic structure has a repeated unit cell divided into adjacent first and second portions along a direction of periodicity,
the first portion having a first effective refractive index and a first length along the direction of periodicity,
the second portion having a second effective refractive index, which is lower over its optical path compared to the first effective refractive index, and a second length along the direction of periodicity,
wherein the effective refractive indexes and lengths of the portions are configured to provide:
an optical path length of the unit cell in the direction of periodicity that equals an integer multiple of a wavelength present in the spectrum of the radiation and
an optical path length of the second portion in the direction of periodicity that is equal to half of an integer multiple of the wavelength present in the spectrum of the radiation.

28. The method of embodiment 26 or embodiment 27, wherein the optical path length of the second portion in the direction of periodicity is equal to half of the wavelength present in the spectrum of the radiation.

29. The method of any of embodiments 26 to 28 wherein the first portion is sub-segmented to generate the first effective refractive index.

30. The method of embodiment 29 wherein the first portion is sub-segmented by a periodic substructure that has a duty cycle selected to generate the first effective refractive index.

31. The method of any of embodiments 26 to 30 wherein the second portion is sub-segmented to generate the second effective refractive index.

32. The method of embodiment 31 wherein the second portion is sub-segmented by a periodic substructure that has a duty cycle selected to generate the second effective refractive index.

33. The method of any of embodiments 26 to 32 wherein the periodic structure has a third portion interleaved with sequences of the repeated unit cells along the direction of periodicity, wherein the third portion has a third effective refractive index, and a third length along the direction of periodicity longer than the first length, and wherein the effective refractive indexes and lengths of the portions are configured to provide:

an optical path length of a sum of: a plurality of the first portion; a plurality of the second portion; and the third portion, in the direction of periodicity, that equals an integer multiple of a wavelength present in the spectrum of the radiation.

34. The method of embodiment 33, wherein the third effective refractive index equals the first effective refractive index.

35. The method of embodiment 33 or embodiment 34, wherein the third portion is sub-segmented to generate the third effective refractive index.

36. The method of embodiment 35, wherein the third portion is sub-segmented by a periodic substructure that has a duty cycle selected to generate the third effective refractive index.

37. A mark on a substrate comprising a structure configured to scatter radiation incident on a surface plane of the mark, the scattering mainly by excitation of a resonant mode in the structure parallel to the surface plane.

38. A substrate comprising the mark of any preceding embodiment.

39. A method of alignment comprising the steps:

illuminating the substrate of embodiment 38 with radiation;

detecting the radiation scattered by the mark arising from the illumination; and determining a position of the mark using the detected radiation.

40. A method of determining an overlay error comprising the steps:

illuminating the overlay target according to embodiment 13 with radiation;

detecting radiation scattered by the overlay target arising from the illumination; and determining an overlay error between the upper and lower marks using the detected radiation.

Although specific reference may be made in this text to the use of lithographic apparatus in the manufacture of ICs, it should be understood that the lithographic apparatus described herein may have other applications, such as the processing of substrates in the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "field"/"die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A mark formed on a planar substrate, the mark comprising a periodic structure configured to scatter radiation incident on a surface plane of the mark, the surface plane parallel to the substrate's plane, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity, wherein the effective refractive indexes and lengths of the portions are configured to provide:

an optical path length of the repeated unit cell in the direction of periodicity that essentially equals an integer multiple of a wavelength present in the spectrum of the radiation; and an optical path length of the second portion in the direction of periodicity that is essentially equal to half of an integer multiple of the wavelength present in the spectrum of the radiation.

2. The mark of claim 1, wherein the optical path length of the second portion in the direction of periodicity is equal to half of the wavelength present in the spectrum of the radiation.

3. The mark of claim 1, wherein the first portion is sub-segmented to generate the first effective refractive index.

4. The mark of claim 1, wherein the first portion is sub-segmented by a periodic substructure that has a duty cycle selected to generate the first effective refractive index.

5. The mark of claim 1, wherein the second portion is sub-segmented to generate the second effective refractive index.

6. The mark of claim 5, wherein the second portion is sub-segmented by a periodic substructure that has a duty cycle selected to generate the second effective refractive index.

7. The mark of claim 1, wherein the periodic structure has a third portion interleaved with sequences of the repeated unit cells along the direction of periodicity,
wherein the third portion has a third effective refractive index, and a third length along the direction of periodicity longer than the first length, and
wherein the effective refractive indexes and lengths of the portions are configured to provide:
an optical path length of a sum of: a plurality of the first portion; a plurality of the second portion; and the third portion, in the direction of periodicity, that equals an integer multiple of a wavelength present in the spectrum of the radiation.

8. The mark of claim 7, wherein the third effective refractive index equals the first effective refractive index.

9. The mark of claim 7, wherein the third portion is sub-segmented to generate the third effective refractive index.

10. The mark of claim 9, wherein the third portion is sub-segmented by a periodic substructure that has a duty cycle selected to generate the third effective refractive index.

11. A substrate comprising the mark according to claim 1.

12. A method of alignment, the method comprising:
illuminating an alignment mark on a planar substrate with radiation, the alignment mark in accordance with the mark of claim 1;
detecting radiation scattered by the alignment mark arising from the illumination; and
determining a position of the alignment mark using the detected radiation.

13. An overlay target comprising a lower mark in accordance with the mark of claim 1, overlaid with an upper mark having a pitch the same as the lower mark.

14. A substrate comprising the overlay target according to claim 13.

15. A method of determining an overlay error, the method comprising:
illuminating an overlay target on a planar substrate with radiation, the overlay target in accordance with claim 13;
detecting radiation scattered by the overlay target arising from the illumination; and
determining an overlay error using the detected radiation.

16. A method for designing a mark comprising a periodic structure configured to scatter radiation incident on a surface plane of the mark, the surface plane parallel to a substrate's plane, wherein the periodic structure has a repeated unit cell divided into adjacent first and second portions along a direction of periodicity, the method comprising:
determining a first effective refractive index and a first length along the direction of periodicity of the first portion;
determining a second effective refractive index and a second length along the direction of periodicity of the second portion,
wherein the design of the mark comprises the determined effective refractive indexes and lengths of the portions, wherein the determining is based on:
tuning an optical path length of the repeated unit cell in the direction of periodicity towards an integer multiple of a wavelength present in the spectrum of the radiation; and
tuning an optical path length of the second portion in the direction of periodicity towards half of an integer multiple of the wavelength present in the spectrum of the radiation.

17. A method of alignment, the method comprising:
illuminating an alignment mark on a planar substrate with radiation, the alignment mark designed in accordance with the method of claim 16;
detecting radiation scattered by the alignment mark; and
determining a position of the alignment mark using the detected radiation.

18. A non-transitory computer program product comprising machine-readable instructions, that when executed by a processor system, are configured to cause the processor system to at least perform the method of claim 16.

19. A method for selecting a wavelength present in the spectrum of radiation incident on a surface plane of a mark on a substrate, the surface plane parallel to the substrate's plane, the mark comprising a periodic structure having a repeated unit cell divided into adjacent first and second portions along a direction of periodicity, the method comprising:
obtaining an optical path length of the repeated unit cell in the direction of periodicity;
obtaining an optical path length of the second portion in the direction of periodicity; and
selecting a wavelength comprised within the spectrum for which the optical path length of the repeated unit cell in the direction of periodicity essentially equals an integer multiple of the wavelength and the optical path length of the second portion in the direction of periodicity essentially equals half of an integer multiple of the wavelength.

20. A non-transitory computer program product comprising machine-readable instructions, that when executed by a processor system, are configured to cause the processor system to at least perform the method of claim 19.

* * * * *